United States Patent
Hung et al.

(10) Patent No.: US 7,257,029 B2
(45) Date of Patent: Aug. 14, 2007

(54) SYSTEMS AND METHODS FOR IMPROVED PROGRAMMING OF FLASH BASED DEVICES

(75) Inventors: Chun-Hsiung Hung, Hsinchu (TW); Chuan-Ying Yu, Taichung (TW)

(73) Assignee: Macronix International Co., Ltd. (TW)

( * ) Notice: Subject to any disclaimer, the term of this patent is extended or adjusted under 35 U.S.C. 154(b) by 36 days.

(21) Appl. No.: 11/188,505

(22) Filed: Jul. 25, 2005

(65) Prior Publication Data
US 2007/0019470 A1 Jan. 25, 2007

(51) Int. Cl.
*G11C 11/34* (2006.01)
*G11C 7/00* (2006.01)

(52) U.S. Cl. .......................... 365/185.18; 365/185.05; 365/185.27

(58) Field of Classification Search ........... 365/185.18, 365/185.27, 185.05
See application file for complete search history.

(56) References Cited

U.S. PATENT DOCUMENTS

| 6,031,766 | A | * | 2/2000 | Chen et al. | 365/185.3 |
| 6,104,636 | A | * | 8/2000 | Tada | 365/185.24 |
| 6,166,955 | A |   | 12/2000 | Lu et al. | |
| 2003/0174540 | A1 | * | 9/2003 | Fan et al. | 365/185.29 |

* cited by examiner

*Primary Examiner*—Son Dinh
(74) *Attorney, Agent, or Firm*—Baker & McKenzie LLP

(57) ABSTRACT

A flash based device in configured for soft programming to correct for over-erase effect; however, the soft programming current is limited so as not to exceed the current that can be supplied during soft programming. Additionally, the voltage on the source node of each cell on the flash based device is maintained at a non-zero level, in order to allow for the use fo a higher word line voltage, but help prevent an over soft programming effect.

20 Claims, 7 Drawing Sheets

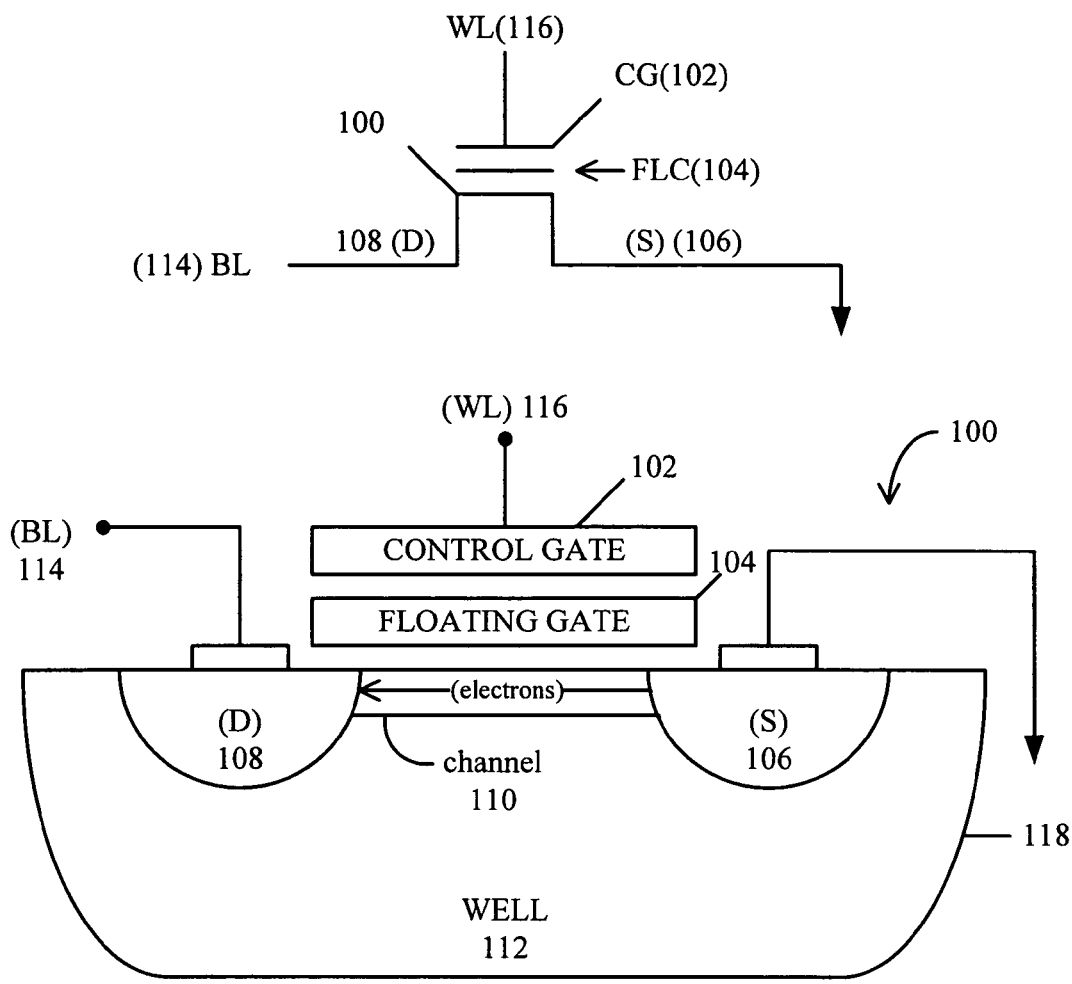
FIG. 1B
FIG. 1A
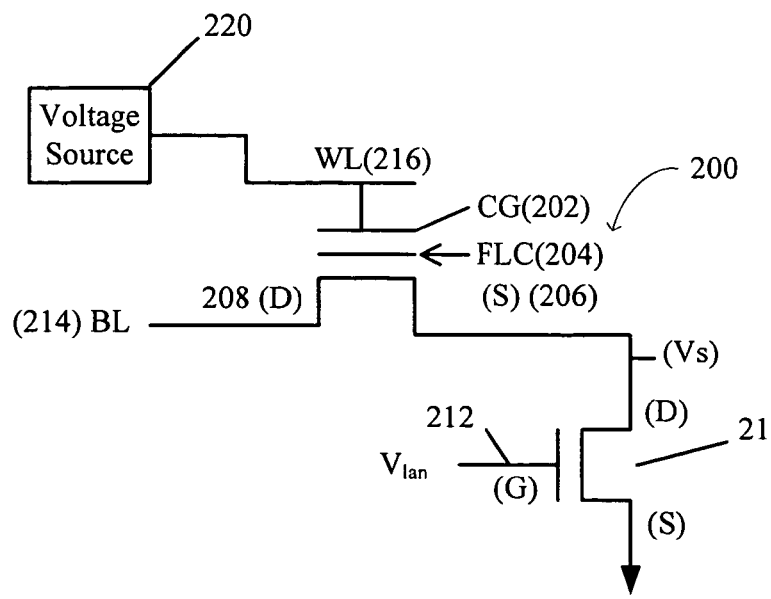
FIG. 2

SYSTEMS AND METHODS FOR IMPROVED PROGRAMMING OF FLASH BASED DEVICES

BACKGROUND

1. Field of the Invention

The invention relates generally to flash based devices and more particularly to systems and methods for efficient programming and erasing of such devices.

2. Background of the Invention

Flash based devices, such as flash based memory devices, comprise a plurality of cells that can be electrically programmed and erased. Each cell represents a bit of information and are typically arranged into words, where each word comprises a certain number of bits. Each cell also typically comprises one or more transistors. In order to reduce the overall size of a flash based circuit, single transistor cells are often preferred. One well known type of single transistor cell used in conventional flash based devices makes use of a single transistor with a special construction known as a floating gate construction, and is referred to as a floating gate transistor.

FIG. 1A is a diagram illustrating a floating gate transistor 100. As can be seen, floating gate transistor 100 comprises a stacked gate configuration above a silicon substrate 118. The stacked gate configuration comprises a control gate 102 stacked above a floating gate 104, which is in turn above the silicon substrate 118. The gates 102 and 104 are often constructed from polysilicon material and are separated by oxide layers (not shown). A drain (D) region 108 and source (S) region 106 are then formed within a well 112 in silicon substrate 118. It will be understood that the drain 108 and source 106 regions are of opposite doping relative to well 112. For example, if drain 108 and source 106 are N-type regions, then well 112 will be a P-type region. In triple well configurations, a second well surrounding well 112 can also be included in silicon substrate 118. The region of silicon substrate 118 below floating gate 104 is referred to as the channel region, or channel 110.

FIG. 1B is a schematic diagram depicting the schematic equivalent of floating gate transistor 100. As can be seen, for various operations control gate 116 is coupled with a Word Line (WL) voltage 116, and drain 108 is coupled with a Bit Line (BL) voltage 114. Source 116 is then often coupled to ground as explained below.

There are three main operation performed on a flash cell, e.g., comprising a floating gate transistor 100. These operations are read, write, and erase. The write operation can also be referred to as a programming operation. Typically, a Flash based device, i.e., a flash memory device, is erased and then programmed with instructions or code. In operation, the code is then accessed and read by a device such as a processor.

A cell is programmed by applying a relatively high programming voltage to control gate 102 and a lower voltage to drain 108. For example, conventional device often use a control gate voltage 116 of 9-10 volts and a drain voltage 114 of 5 volts during programming. The source voltage is typically maintained at ground, or 0 volts. The programming voltages are configured to create a relatively high voltage potential between drain 108 and source 106, which causes electrons to flow from source 106 to drain 108 through channel 110. Additionally, the relatively high voltage applied to control gate 102 raises the voltage potential of floating gate 104. This high potential attracts electrons flowing through channel 110, causing them to "tunnel" through the oxide layer (not shown) separating floating gate 104 from silicon substrate 118. This phenomenon is often referred to as hot carrier injection.

A successful programming operation results in injection of enough electrons onto floating gate 104 to achieve a desired threshold voltage (Vt) for flash cell 100. The threshold voltage (Vt) is the voltage that must be applied to control gate 102 to cause conduction through channel 110 during a read operation.

Upon removal of the programming voltages, the injected electrons are trapped on floating gate 104, creating a negative voltage that must be overcome in order to effect a read. The threshold voltage (Vt) needed to overcome the negative effect of the injected electrons can for example be 4 volts; however, The threshold voltage (Vt) can vary by implementation, Moreover, as discussed below, the threshold voltage (Vt) can vary by cell due to process variations.

A cell 100 is read by applying a voltage 116 to control gate 102, and a lower voltage 114 to drain 108, while grounding source 106. For example, a voltage of 5 volts can be applied to control gate 102 and a voltage of 1 volt to drain 108. Current on the bit line (BL) is then sensed to determine whether cell 100 is programmed. If cell 100 is programmed and the threshold voltage (Vt) is relatively high, e.g., 4 volts, then the bit line (BL) current will be approximately 0 amps. If the cell is not programmed and the threshold voltage is relatively low, e.g., 2 volts, then the control gate voltage 116 will enhance channel 110 and the BL current will be relatively high.

A cell 100 can be erased by applying a high voltage to source 106, a lower voltage to control gate 102, and allowing drain 108 to float. For example, a voltage of 12 volts can be applied to source 106, while control gate 102 is grounded, or a lower voltage, such as 5 volts can be applied to source 106, while a negative voltage, such as 10 volts, is applied to control gate 102. This causes the electrons injected onto floating gate 104 to undergo a phenomenon known as Fowler-Nordheim tunneling from floating gate 104, through the oxide layer (not shown) separating floating gate 104 from silicon substrate 118, and to source 106. In addition, channel 110 is also erased by letting drain 108 and source 106 float and applying an erase voltage to control gate 102.

A problem with conventional flash based devices is that the manufacturing variances can cause some cells to become "over-erased" before other cells are sufficiently erased. In over-erased cells, floating gate 104 has a very low negative charge, or even a positive charge. An over-erased cell can act as a depletion mode transistor that cannot be turned off by normal operating voltages. Thus, an over-erased cell will have an associated leakage current that can prevent accurate reads of not just the over-erased cell, but other cells coupled with the same BL. To combat this problem, a process referred to as soft-programming can be implement to correct for over-erased cells; however, conventional soft programming techniques can be inefficient because voltage 116 that can be applied to the WL during soft programming is limited. A higher voltage 116 would increase the efficiency of soft programming, but too high a voltage can cause an over soft programming condition.

Further, if the over-erase condition for a given cell is severe, it can require more current to correct than can be supported. Because many cells are often soft programmed at the same time, the current required can vary significantly depending on how many cells are over-erased. This can make it difficult to predict how much current will be needed. In fact, the current required can be so great that it exceeds what can be supplied by the charge pump coupled with the drain during soft programming.

SUMMARY

A flash based device in configured for soft programming to correct for over-erase effect; however, the soft programming current is limited so as not to exceed the current that can be supplied during soft programming.

In another aspect, the voltage on the source node of each cell on the flash based device is maintained at a non-zero level, in order to allow for the use of a higher word line voltage, but help prevent an over soft programming effect.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIG. 1A is a diagram of a floating gate transistor;

FIG. 1B is a schematic representation of the floating gate transistor of FIG. 1A;

FIG. 2 is a diagram of a floating gate flash cell configured in accordance with one embodiment;

DETAILED DESCRIPTION OF THE PREFERRED EMBODIMENTS

FIG. 2 is a diagram of a floating gate flash cell configured in accordance with one embodiment of the systems and methods described herein. As can be seen, the flash cell comprises a single floating gate transistor 200 the source 206 of which is coupled to ground through a NMOS transistor 210. As is explained below, coupling source 206 to ground through transistor 210 can help limit the required soft programming current.

Conventionally, after an erase operation, an over-erase correction operation is performed. Often, an under-erase correction operation is performed before the over-erase correction operation. Under-erase correction can be performed on a cell-by-cell basis one row at a time. For example, the cell in the first row and column position can be addressed and erase verified by applying an erase verify voltage, such as a 4 volts, to the WL and a lower voltage, such as 1 volt, to the BL, while grounding the source. An amplifier can then be used to sense the BL current and thereby determine if the cell Vt is above a minimum level, such as 2 volts. If the cell is under-erased, meaning the cell Vt is too high, then the BL current will be low. In this case, an erase pulse can be applied to all of the cells and the first cell can be erase verified again. This process can be repeated for all of the cells.

After application of an erase pulse, over-erase correction can also be performed. This process can comprise performing an over-erase verify on all of the BLs in the array in sequence. Over-erase verify can comprise grounding the WLs, applying a low voltage, e.g., 1 volt to the first BL, and sensing the BL current for the first BL to determine if it is above a predetermined value. If the BL current is above the predetermined value, then this indicates that at least one cell connected to the first BL is over-erased and drawing leakage current. In this case, an over-erase correction pulse can be applied to the first BL. For example, a 5 volt pulse can be applied for a certain length of time such as 100 μs.

After application of the over-erase correction pulse the BL can be verified again. If the BL current is still too high, then another over-erase correction pulse can be applied to the BL. This procedure can be repeated for all of the BLs and can be repeated as many times as necessary until all of the BL currents are lower than the read current. By performing the over-erase correction procedure after each erase pulse, the number an dextent of over-erased cells can be reduced. Further, because over-erased cells are corrected after each erase pulse, BL leakage current us reduced during the erase verify procedure. This helps ensure that no over-erased cells will exist a the end of the erase process.

Figure 5:
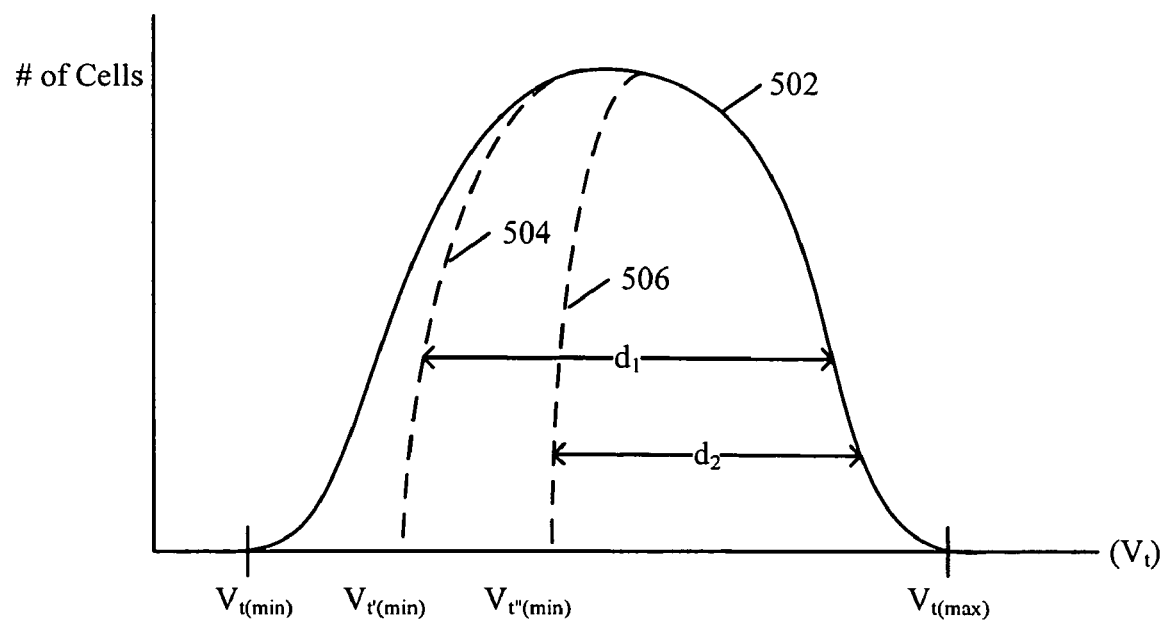
FIG. 5 is a diagram illustrating the Vt for cells of an array included in the Flash memory of FIG. 3 after an erase operation with and without over-erase correction.

FIG. 5 is a diagram illustrating the Vt for cells of an array after an erase operation with and without over-erase correction. As can be seen, after an erase operation, the cells can have threshold voltages ranging from a minimum Vt(min) to a maximum Vt(max). The least erased cells will have a high Vt, near Vt(max), while the most over-erased cells will have a low Vt near Vt(min). Without over-erase correction, Vt(min) can be very low, even negative as indicated by curve 502. With over-erase correction, the minimum threshold voltage can be raised significantly to a Vt'(min), which reduces the range ($d_1$) of cell threshold voltages (Vt).

Even with over-erase correction, however, Vt'(min) can still be quite low. Because the background leakage current of a cell varies as a function of Vt, cells with a Vt near Vt'(min) can still have a relatively high leakage current. Since there can be many cells connected to a single BL, the overall background leakage current can be enough to exceed the read current and thus, prevent accurate reads. Accordingly, it can be desirable to reduce the overall BL leakage current by increasing Vt'(min) and reducing the range ($d_1$) of threshold voltages (Vt). This can be accomplished through a process known as soft programming.

Soft programming comprises applying a ramped voltage to the control gate 202 of the a floating gate transistor 200, while applying a voltage to the drain 208, and grounding the source 206. Soft programming makes use of the hot electron injection mechanism to increase the threshold voltages of the most over-erased cells. This can reduce the range of threshold voltages to a range ($d_2$), by increasing the minimum threshold voltage to Vt''(min).

The ramped voltage applied to the control gate can, for example, be less than the Vt of the least erased cell. The ramped voltage is supplied by a voltage source 220 connected with the control gate 202 of floating gate transistor 200.

It can be difficult to control how severe the over-erase problem is for any given cell and fro the array overall. Accordingly, the current required for soft programming can be quite high an can even be more than can be supplied. In order to prevent this from occurring, source 206 of cell 200 is not connected directly to ground as with conventional cells. Rather, source 206 is coupled to ground through NMOS transistor 210. A constant voltage (Vcon), which can be derived from a reference voltage, is coupled to the gate 212 of NMOS device 210. This produces a constant current scheme that limits the current required during soft programming.

The current needed during soft programming is limited because the gate-source voltage (Vgs) of NMOS transistor 210 is kept constant. Thus, even if many cells experience heavy hot electron effect during soft programming and start to draw large currents, NMOS transistor 210 will go into saturation and cause Vs to increase quickly. This will cause the drain-source voltage (Vds) of floating gate transistor 200 to decrease, which will reduce the hot electron effect. In this manner, the current consumption during soft programming is kept more constant.

In order to improve the efficiency and effectiveness of the soft programming a higher WL voltage 216 can be applied to control gate 202 in accordance with the systems and methods described herein. For example, a WL voltage 216 in the range of 1V-2V can be used, which is higher than the hot electron convergence level, which can be 0.8V. In certain instances, however, an over soft programming effect will be produced. The over soft programming effect is due to a slight hot electron effect in non-over-erased cells at the end of the soft programming pulse. This can cause the Vt of cells with threshold voltages (Vt) near Vt (max) to shift to a level that is higher than the erase verify level. This can also cause the read current for these cells to become smaller than normal, which can degrade read speeds and even cause read errors.

Figure 4:
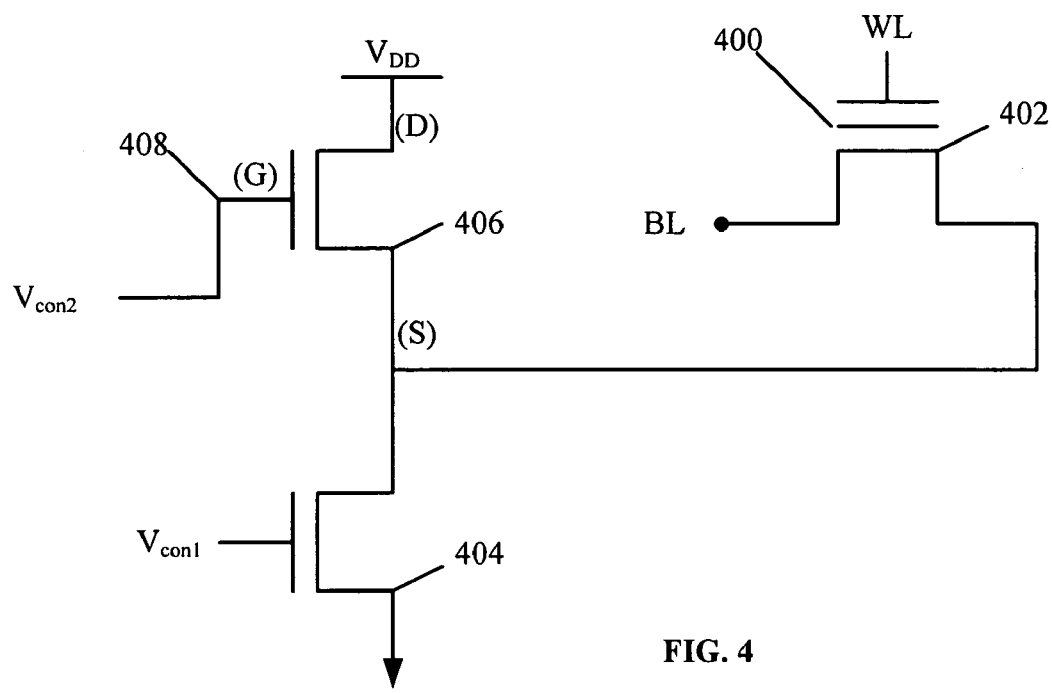
FIG. 4 is a diagram of a floating gate flash cell configured in accordance with another embodiment.

To combat this effect, an NMOS device 406 can be, in accordance with one embodiment, connected between the supply voltage (VDD) and the source 402 of a floating gate transistor cell 400 as illustrated in FIG. 4. A constant voltage (Vcon$_2$), derived from a reference voltage can be coupled to the gate 408 of NMOS transistor 406. NMOS transistor 406 can thus provide a small current to the source node 402 of floating gate transistor 400 in order to maintain Vs at a minimum level, for example approximately 0.8V. This can prevent the over soft programming effect from occurring with high WL voltage during soft programming. As mentioned the higher WL voltage leads to more efficient and effective soft programming. Accordingly, by using the circuit of FIG. 4, efficient and effective soft programming can be achieved with little or no over soft programming effect. Moreover, NMOS 404 can also be included in order to limit the soft programming voltage as with NMOS 210 in FIG. 2.

Figure 6:
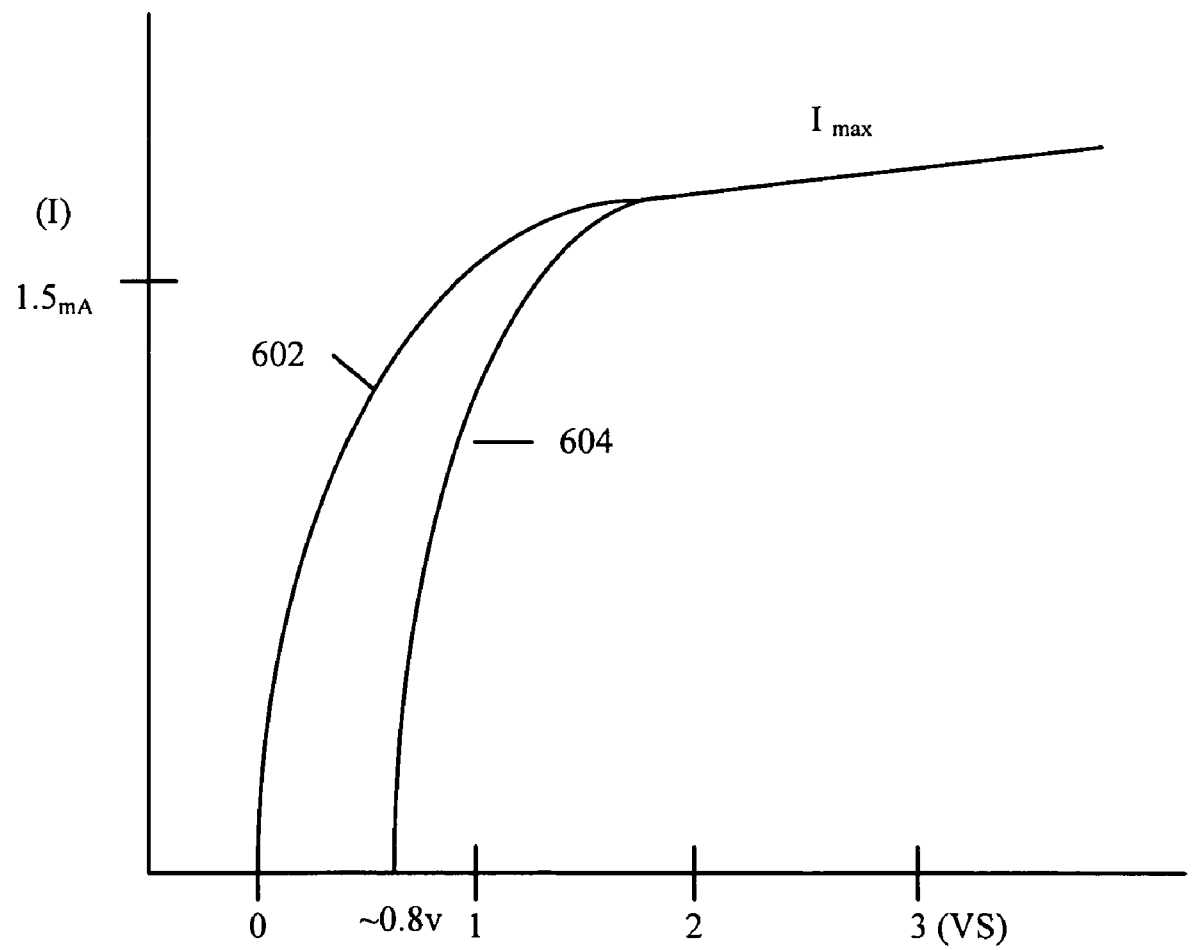
FIG. 6 is a graph of the soft programming current versus Vs for cells of an array included in the Flash memory of FIG. 3 for conventional soft programming and for enhanced soft programming in accordance with one embodiment.

FIG. 6 is a graph of the soft programming current versus Vs for conventional soft programming (curve 602) and for enhanced soft programming using the systems and methods described herein (curve 604). As can be seen, when the soft program current approaches 1.5 mA, Vs will increase quickly reducing the Vds of cell 400 and limiting the supplied current. The current can be limited to a maximum (Imax).

In conventional designs, when less cells need to be soft programmed, less current is consumed, so Vs approaches zero in curve 602. When Vs is close to 0, Vds of the cell will be quite high, which can induce unnecessary hot electron effect and raise the cell Vt. In a device configured in accordance with FIG. 4, however, when no current is being consumed, i.e., few or no cells require soft programming, Vs is still at approximately 0.8V, and the cell Vds is not high enough to enhance any hot electron effect. Accordingly, over soft programming can be reduced or even eliminated.

Figure 7A:
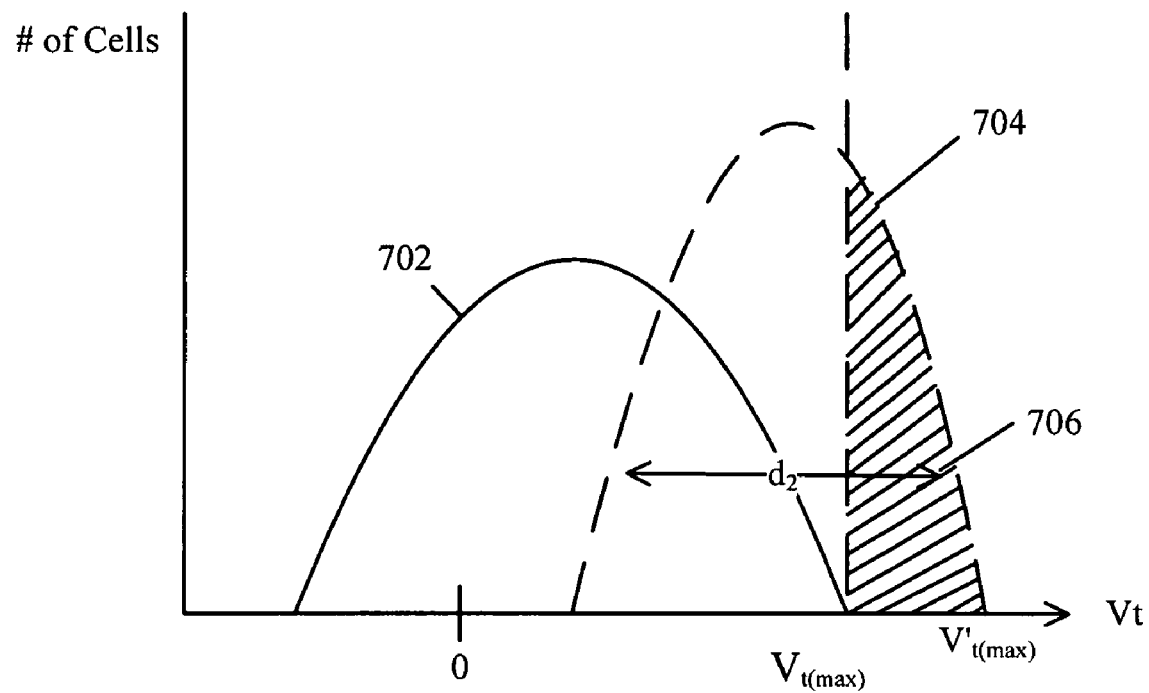
FIG. 7A is a diagram illustrating the shift in threshold voltages (Vt) for cells in the Flash Memory of FIG. 3 using a high WL voltage using conventional soft programming technique.
Figure 7B:
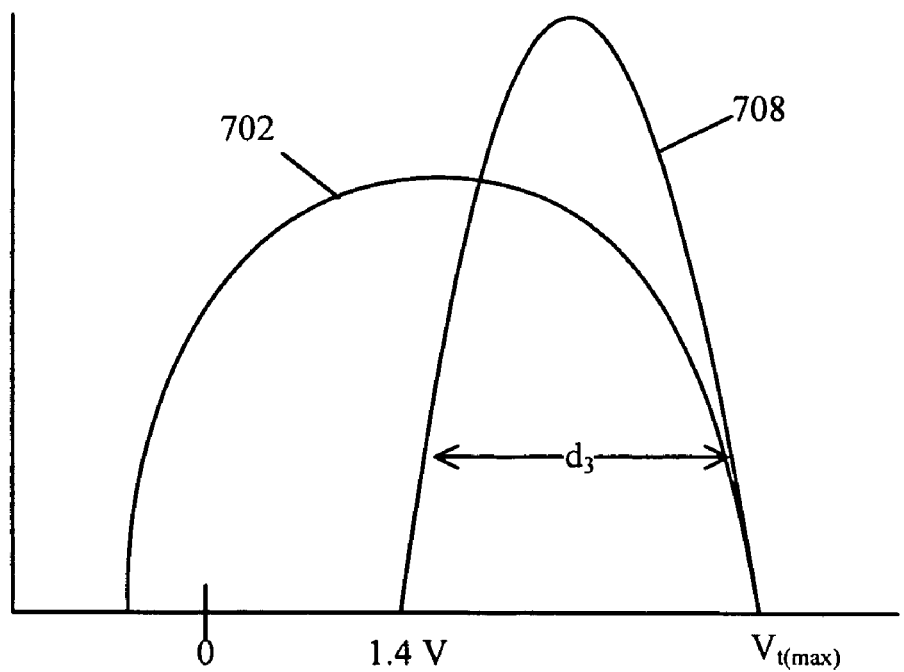
FIG. 7B is a diagram illustrating the shift in threshold voltages (Vt) for cells in the Flash Memory of FIG. 3 using enhanced soft programming techniques in accordance with the systems and methods described herein.

This can be illustrated by the graphs of FIGS. 7A and 7B, which illustrate the shift in threshold voltages (Vt) for cells in a flash device using a high WL voltage using conventional soft programming techniques (FIG. 7A) and using enhanced soft programming techniques in accordance with the systems and methods described herein (FIG. 7B). Curve 702 in FIG. 7A is the original threshold voltage curve before soft programming. Curve 704 is the threshold voltage curve after conventional soft programming is applied. As can be seen in FIG. 7A, conventional soft programming will reduce the range (d$_2$) of threshold voltages (Vt) as described above; however, if a high WL voltage is used during soft programming, the maximum threshold voltage will shift from Vt(max) to Vt'(max), resulting in a number of cells, represented by area 706, that are over soft programmed.

FIG. 7B depicts the results of enhanced soft programming of cells using the systems and methods described herein. Thus, curve 708 depicts the threshold voltage curve after enhanced soft programming is applied. As can be seen, the threshold voltage range (d$_3$) has been reduced, without any over soft programming effect. In one embodiment, for example, d$_3$ is equal to approximately 0.8V, with a Vt(min) of 1.4V.

Figure 8:
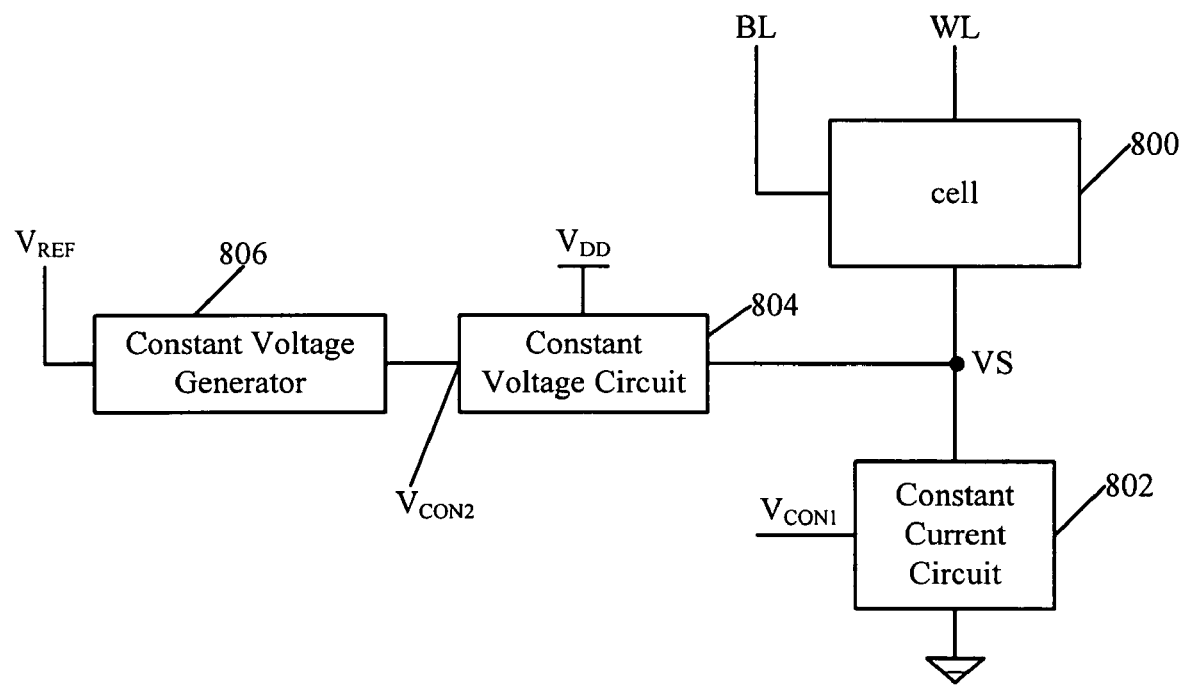
FIG. 8 is a diagram illustrating a specific embodiment of a soft programming circuit configured in accordance with one embodiment.

FIG. 8 is a diagram illustrating a specific embodiment of a soft programming circuit configured in accordance with one embodiment of the systems and methods describe herein. In FIG. 8, a cell 800 is coupled to a WL and a BL. The source of cell 800 is then coupled to ground through a constant current circuit 802 and to VDD through constant voltage circuit 804. Constant current circuit 802 is configured, as described above, to limit the soft programming current to avoid over taxing the current source. Constant voltage circuit 804 is configured, as described above to maintain Vs at, or near, a constant no-zero voltage during soft programming. Depending on the embodiment, a constant voltage generation circuit 806 can be coupled to constant voltage circuit in order to generate a constant voltage (Vcon$_2$) from a reference voltage (Vref) that can drive constant voltage circuit 804. Constant current circuit 802 can be driven by a constant voltage (Vcon$_1$).

Figure 9:
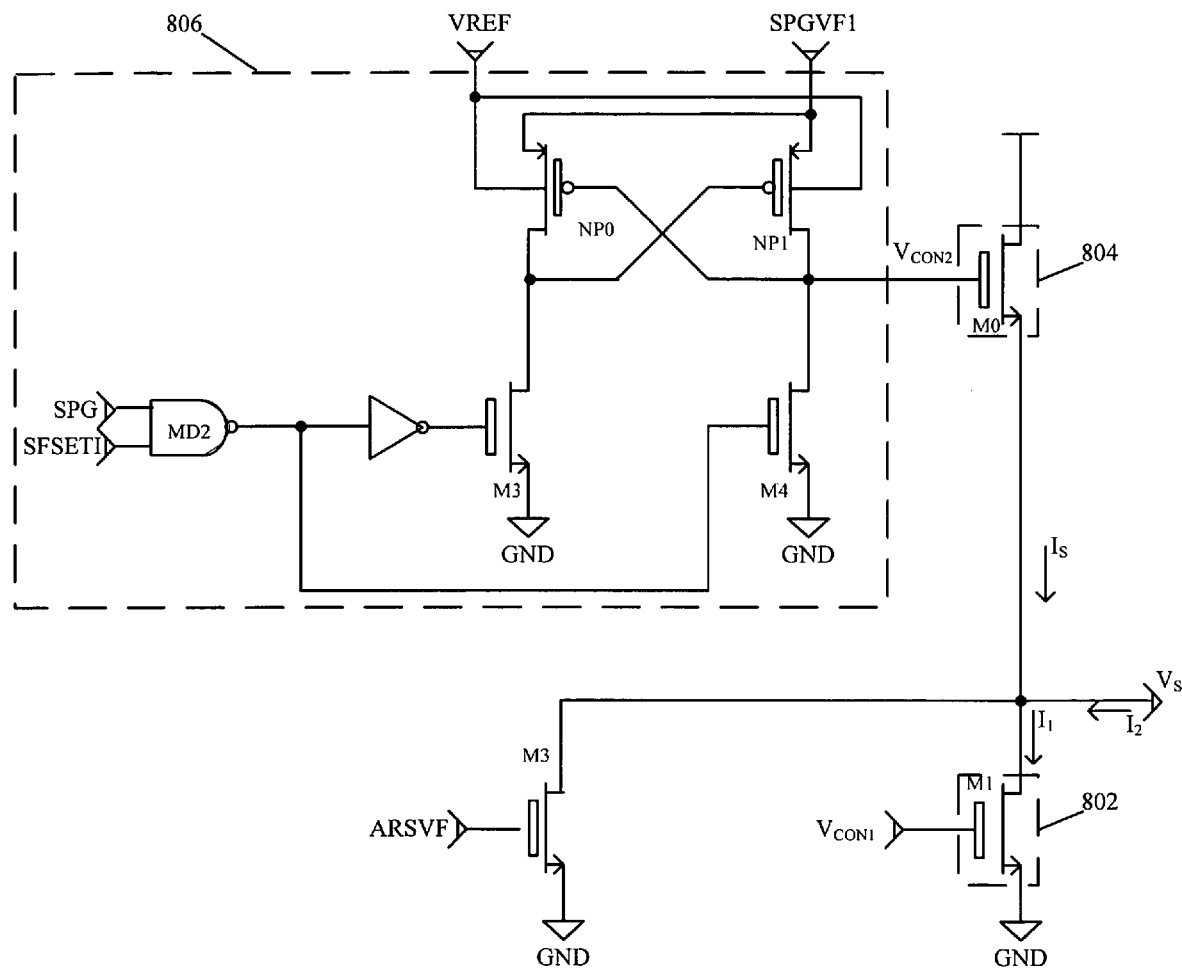
FIG. 9 is a diagram illustrating a specific embodiment of the circuit of FIG. 8.

FIG. 9 is a diagram illustrating a specific embodiment of the circuit of FIG. 8. In FIG. 9, constant current circuit 802 comprises a transistor M1 couple between the Vs node and ground. A constant current source (Vcon$_1$) is coupled with the gate of transistor M1 and is configured to limit the soft programming current as described above. Vcon$_1$ can be derived from a reference voltage. In addition, Vcon$_1$ combined with M1 sizing can be configured to determine the soft programming current limit.

Constant voltage circuit 804 comprises a transistor M0 coupled between VDD and the Vs node. Constant voltage generator 806 is designed to generate a constant voltage (Vcon$_2$) from reference voltage (Vref). Vref can in turn be derived from a reference voltage and can be stable over different VDD levels and temperatures. Vref combined with M0 sizing can be configured to determine the minimum Vs voltage level.

When soft programming begins to pull current that is higher than M0 allows, Vs will rise quickly, which means that the Vds of associate cells will decrease. This will then cause both the Vs and current to decrease. Therefore, constant current during soft programming can be provided.

The operation of the circuit illustrated in FIG. 9 can be explained further by examining the currents I1, I2, and I3 at the Vs node. I1 is a constant current designed to limit the soft programming current, which is represented by I2. I3 is configured to maintain Vs at a set level, e.g., approximately 0.8 v, in accordance with the following equation Vs=I3× RM0, where RM0 is the resistance of transistor M0. Further, I1=I2+I3. But when I2>I1 by even a little, Vs will rise to a quite high level and I3~0. When close to the end of the soft programming cycle, I2~0, I1=I3. In this situation, RM0/RM1 will set the Vs voltage level.

Figure 3:
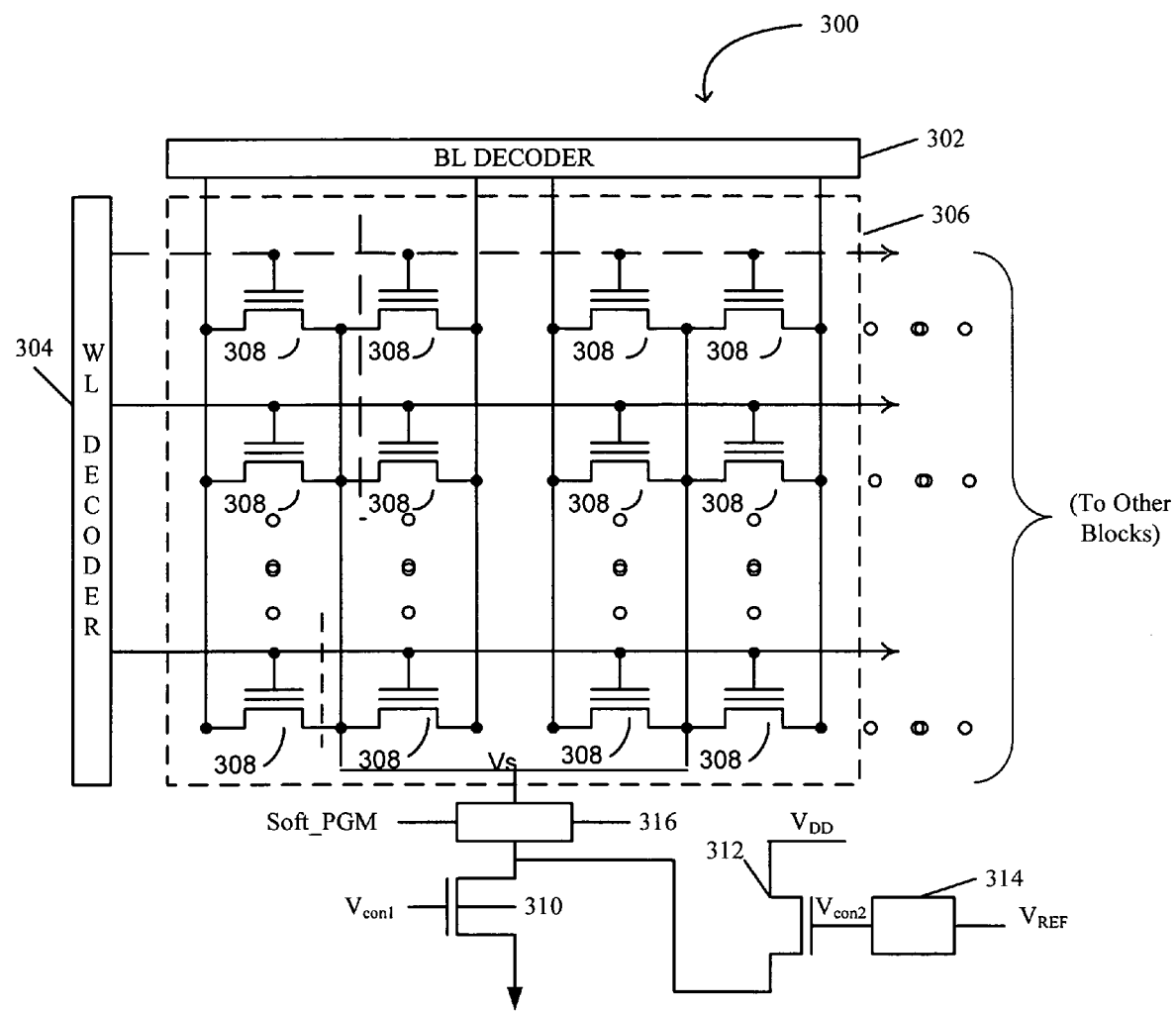
FIG. 3 is a diagram of a portion of a Flash memory device 300 configured in accordance with one embodiment.

FIG. 3 is a diagram of a portion of a Flash memory device 300 configured in accordance with one embodiment of the systems and methods described herein. Flash memory 300 comprises a plurality of cells 308, where each cell comprises a single floating gate transistor. Cells 308 are arranged in an array of rows and columns. A certain number of cells can comprise a black 306, and flash memory 300 can comprise a plurality of blocks. In certain devices, cells can be erased and programmed by black as is well known. The control gates of the floating gate transistors are interface with word lines that are controlled by a word line decoder 304. The drains of the floating gates are interfaced with bit lines that are controlled by a bit line decoder 302. Thus, an individual cell 308 can be accessed and read by activating the appropriate word line and bit line.

During soft programming, the sources of cells 308 can be coupled to ground via a transistor 310. For example, during soft programming a switching device 314 can be actuated such that the source node (Vs) is couple with transistor 310. The source node can also be coupled to VDD through transistor 312. Transistors 310 and 312 can be configured to provide soft programming current limit and a non-zero source node voltage (Vs) as described above. Transistor 310 can be driven by a constant voltage (Vcon$_1$) and transistor 312 can be driven by a constant voltage (Vcon$_2$), which can be generated from a reference voltage (Vref) by a constant voltage generator 314.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A Flash based device, comprising:
   a cell, the cell comprising a control gate and a source node;
   a constant current circuit coupled with the source node, the constant current circuit configured to limit the current drawn by the cell during a soft programming cycle; and
   a constant voltage circuit coupled with the source node, the constant voltage circuit configured to maintain a non-zero voltage level on the source node.

2. The Flash based device of claim 1, wherein the cell comprises a floating gate transistor, comprising a control gate, a drain, and a source, the source coupled with the source node.

3. The Flash based device of claim 1, wherein the constant current circuit comprises a transistor.

4. The Flash based device of claim 3, wherein the transistor comprises a drain, coupled with the source node, a control gate, and a source, the source coupled to a ground node, and wherein the control gate is driven by a control voltage.

5. The Flash based device of claim 4, wherein the control voltage and the size of the transistor determine the soft programming current limit.

6. The Flash based device of claim 3, wherein the transistor is an NMOS transistor.

7. The Flash based device of claim 1, wherein the constant voltage circuit comprises a transistor.

8. The Flash based device of claim 7, wherein the transistor comprises a drain, coupled with a supply voltage, a gate driven by a control voltage, and a source coupled with the source node.

9. The Flash based device of claim 8, wherein the control voltage and the size of the transistor set the non-zero voltage level.

10. The Flash based device of claim 9, wherein the control voltage is generated from a reference voltage.

11. The Flash based device of claim 7, wherein the transistor is an NMOS transistor.

12. A Flash based device, comprising:
    a cell, the cell comprising a control gate and a source node;
    a transistor coupled between the source node and a ground node, the transistor configured to limit the current drawn by the cell during a soft programming cycle; and
    a second transistor coupled between the source node and a supply voltage node, the second transistor configured to maintain a non-zero voltage level on the source node.

13. The Flash based device of claim 12, wherein the cell comprises a floating gate transistor, comprising a control gate, a drain, and a source, the source coupled with the source node.

14. The Flash based device of claim 13, wherein the first transistor comprises a drain, coupled with the source node, a control gate, and a source, the source coupled to a ground node, and wherein the control gate is driven by a control voltage.

15. The Flash based device of claim 14, wherein the control voltage and the size of the first transistor determine the soft programming current limit.

16. The Flash based device of claim 12, wherein the first transistor is an NMOS transistor.

17. The Flash based device of claim 12, wherein the second transistor comprises a drain, coupled with a supply voltage, a gate driven by a control voltage, and a source coupled with the source node.

18. The Flash based device of claim 17, wherein the control voltage and the size of the second transistor set the non-zero voltage level.

19. The Flash based device of claim 18, wherein the control voltage is generated from a reference voltage.

20. The Flash based device of claim 19, wherein the transistor is an NMOS transistor.

* * * * *